United States Patent [19]
Yamazaki

[11] Patent Number: 6,166,396
[45] Date of Patent: *Dec. 26, 2000

[54] SEMICONDUCTOR DEVICES

[75] Inventor: Shunpei Yamazaki, Tokyo, Japan

[73] Assignee: Semiconductor Energy Laboratory Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/683,241

[22] Filed: Jul. 18, 1996

[30] Foreign Application Priority Data

Jul. 27, 1995 [JP] Japan ................................ 7-211195

[51] Int. Cl.[7] .................................................. H01L 29/04
[52] U.S. Cl. .............................. 257/59; 257/72; 257/763; 257/765; 257/435
[58] Field of Search ............................... 257/59, 72, 763, 257/765, 435

[56] References Cited

U.S. PATENT DOCUMENTS

| 4,782,380 | 11/1988 | Shankar et al. | 257/751 |
|---|---|---|---|
| 5,371,398 | 12/1994 | Nishihara | 257/57 |
| 5,604,360 | 2/1997 | Zhang et al. | 257/59 |
| 5,641,994 | 6/1997 | Bollinger et al. | 257/771 |

FOREIGN PATENT DOCUMENTS

6-88973  3/1994  Japan .

*Primary Examiner*—Mark V. Prenty
*Attorney, Agent, or Firm*—Fish & Richardson P.C.

[57] ABSTRACT

In an active matrix liquid crystal display (LCD) device, a conductor line interconnecting a drain of each thin-film transistor and a corresponding pixel electrode constructed with indium tin oxide (ITO) is formed in a three-layer structure in which an aluminum film is sandwiched between a pair of titanium films. This construction prevents poor contact and deterioration of reliability because electrical contact is established between one titanium film and semiconductor and between the other titanium film and ITO. The aluminum film has low resistance which is essential for ensuring high performance especially in large-screen LCDs.

40 Claims, 4 Drawing Sheets

IMPURITY ION

SEMICONDUCTOR DEVICES

BACKGROUND OF THE INVENTION

1. Field of the Invention

The present invention relates to the construction of an active matrix display device such as an active matrix liquid crystal display (LCD) device.

2. Description of the Related Art

In an active matrix LCD device, thin-film transistors are arranged on a sheet of quartz or glass at a high density. It is increasingly required in recent years to raise the level of integration of the thin-film transistors. On the other hand, it is more and more required for the LCD device to provide larger display areas to meet the growing demand for large-screen displays. This is where the LCD device greatly differs from large-scale integrated (LSI) circuits which are required to provide higher integration levels and smaller physical sizes.

Besides the requirement for large-screen display, it is desired to make the conductor lines of the LCD device as narrow as possible so as to provide an increased aperture ratio. If, however, narrow conductor lines are used, problems arising from their increased resistances will become evident.

The active matrix LCD device requires means for masking the thin-film transistors arranged in individual pixels as well as masking means, which is known as a black matrix, for masking edges of individual pixel electrodes. Generally, these masking means including the black matrix are separately arranged from the conductor lines. Such a construction is not preferable though because it complicates processing steps needed for the production of the active matrix LCD device.

One method for reducing conductor line resistance is to use aluminum as a wiring material. However, the use of aluminum could give rise to reliability problems because electrical contacts between aluminum and semiconductor and between aluminum and a transparent conductive coating, which is usually a thin layer of conductive oxide such as indium tin oxide (ITO), are liable to become unstable.

SUMMARY OF THE INVENTION

It is an object of the present invention to provide a construction of an active matrix LCD device, by which an increased aperture ratio is obtainable with a small number of steps in the overall manufacturing process. It is a further object of the invention to provide a construction which can eliminate instability of electrical contact caused by specific wiring materials.

According to the invention, a semiconductor device comprises a conductor line for interconnecting a semiconductor element and a conductive oxide film, the conductor line having a layer structure including an aluminum film sandwiched between a pair of titanium films, wherein one of the titanium films is held in contact with the semiconductor element while the other titanium film is held in contact with the conductive oxide film.

In one specific form of implementation of this construction, a drain region of a thin-film transistor is connected to a pixel electrode constructed with ITO by the conductor line which is formed by sandwiching the aluminum film with the pair of titanium films. More particularly, the drain region made of a semiconductor material is held in contact with one titanium film while the pixel electrode constructed with ITO is held in contact with the other titanium film. This construction provides a solution to the reliability problem arising from the instability of electrical contact between aluminum and semiconductor.

This construction also serves to improve the quality of contact between ITO and the conductor line as the latter is covered by the titanium film. In general terms this means that the invention provides a solution to the reliability problem arising from the instability of electrical contact between aluminum and ITO (or a conductive oxide film in general) as well. Needless to say, an additional advantage comes from the use of aluminum of which resistance is remarkably low.

In a varied form of the invention, a semiconductor device comprises a conductive oxide film which constitutes a pixel electrode, a conductor line for interconnecting the conductive oxide film and a drain region of a thin-film transistor, a first masking film constructed with the same material as the conductor line for masking the thin-film transistor, and a second masking film constructed with the same material as the conductor line for masking edges of the pixel electrode, wherein the conductor line has a layer structure including an aluminum film sandwiched between a pair of titanium films.

As will be discussed later in greater detail, the semiconductor device thus constructed has the pixel electrode constructed with ITO, the conductor line connecting the pixel electrode to the drain region of the thin-film transistor and the first masking film for masking the thin-film transistor. The conductor line has a three-layer structure in which the aluminum film is sandwiched between the pair of titanium films. In addition, the second masking film, or the black matrix, constructed with the same material as used for producing the conductor line masks the edges of the pixel electrode.

What is significant in this construction is that the conductor line, first masking film and black matrix are obtained simultaneously by patterning the same three-layer structure. This serves to simplify the overall manufacturing process, improve production yield and reduce manufacturing costs.

The titanium films are most preferable for sandwiching aluminum from the viewpoint of electrical characteristics in this invention. Chromium films may be employed instead of the titanium films, if desired. However, titanium is more desirable since the titanium film can be more easily patterned by dry etching than the chromium film. Furthermore, a few percent by weight of appropriate impurities may be added to the titanium, to adjust their optical and/or electrical characteristics.

In yet varied form of the invention, a semiconductor device comprises a conductive oxide film which constitutes a pixel electrode. a first conductor line for interconnecting the conductive oxide film and a drain region of a thin-film transistor, a masking film constructed with the same material as the first conductor line for masking the thin-film transistor, and a masking film constructed with the same material as the first conductor line for masking edges of the pixel electrode, a second conductor line connected to a source region of the thin-film transistor, an outgoing conductor line constructed with the same material as the first conductor line, the outgoing conductor line being connected to the second conductor line, wherein the first conductor line has a layer structure including an aluminum film sandwiched between a pair of titanium films.

In one specific form of implementation of this construction, the first conductor line has a three-layer structure in which the aluminum film is sandwiched between the pair of titanium films while the second conductor line is constructed with a titanium film and an aluminum film. The first conductor line, first masking film, black matrix and outgoing conductor line can be formed by patterning the same three-layer structure.

Accordingly, the invention provides a highly reliable construction of semiconductor devices, eliminating instability of contact between wiring materials. The three-layer conductor line configuration is particularly effective in view of low resistance of the aluminum film and good electrical contact between the titanium film and semiconductor and between the titanium film and conductive oxide film.

Remarkable features of the invention can be summarized as follows:

(1) The stacked two-layer structure including the aluminum and titanium films helps reduce voltage drop in individual source lines, and this is particularly evident in large-screen LCD devices;

(2) The stacked two-layer structure including the aluminum and titanium films enhances the reliability of connections between the individual source lines and source regions;

(3) The three-layer structure of individual first conductor lines interconnecting drain regions and pixel electrodes can be used for producing the masking film for masking each thin-film transistor without requiring any additional processing step;

(4) Individual outgoing conductor lines used for connecting to surrounding circuit elements can be created at the same time with the first conductor lines, and the reliability of connections between the individual first conductor lines and source lines can be improved;

(5) The reliability of connections between the first conductor lines and drain regions and between the first conductor lines and ITO pixel electrodes can be improved; and (6) The black matrix can be formed at the same time with the first conductor lines.

As will be recognized from the foregoing discussion, the invention makes it possible to simultaneously produce various elements of the active matrix LCD device without requiring additional processing steps. Moreover, the invention provides improvements in product performance and reliability as well as a reduction in manufacturing costs.

DETAILED DESCRIPTION OF THE PREFERRED EMBODIMENTS

FIRST EMBODIMENT

Figure 1A:
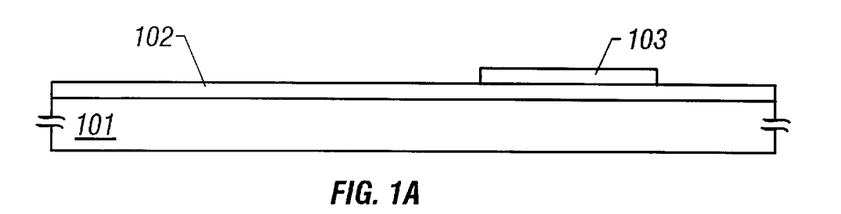
FIGS. 1(A)–1(D) illustrate processing steps for the production of an active matrix circuit according to a first embodiment of the invention.
Figure 1B:
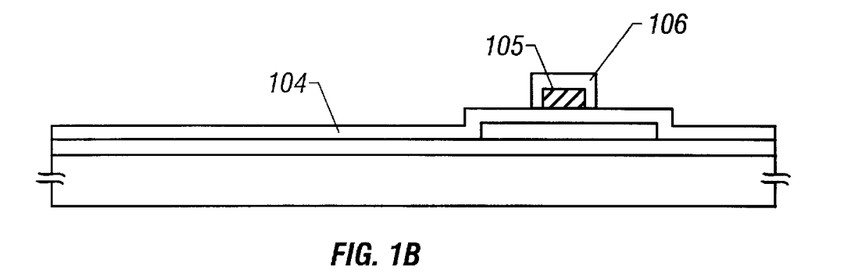
Figure 1C:
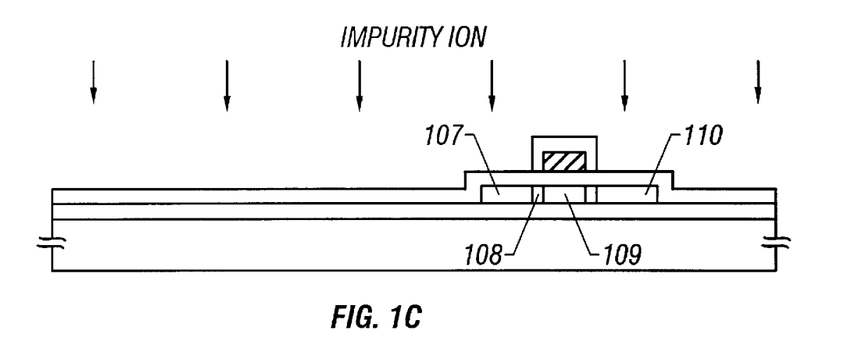
Figure 1D:
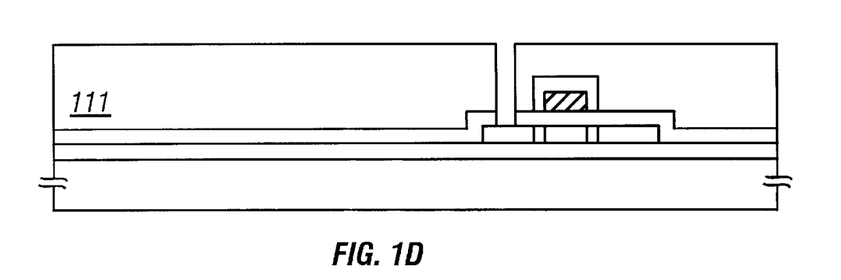
Figure 2A:
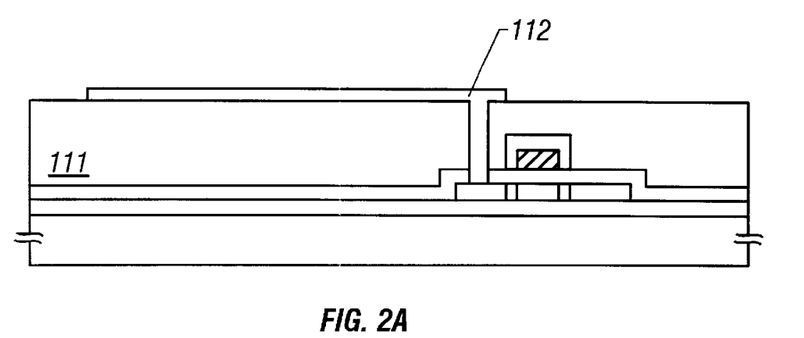
FIGS. 2(A)–2(C) illustrate processing steps for the production of the active matrix circuit which follow the steps shown in FIGS. 1(A)–1(D)
Figure 2B:
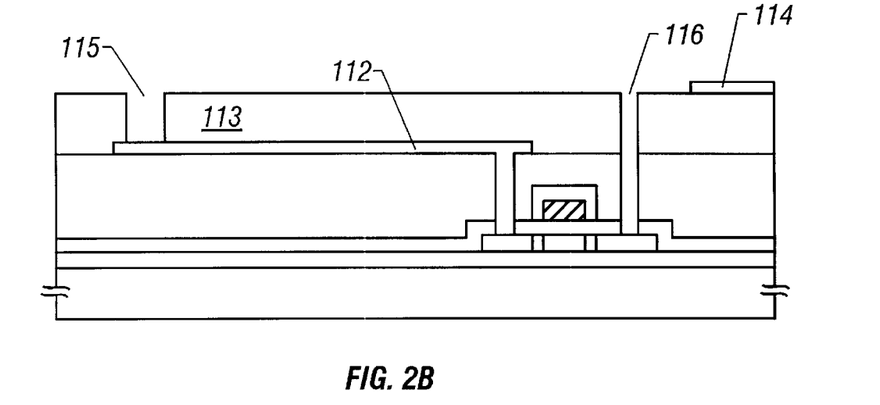
Figure 2C:
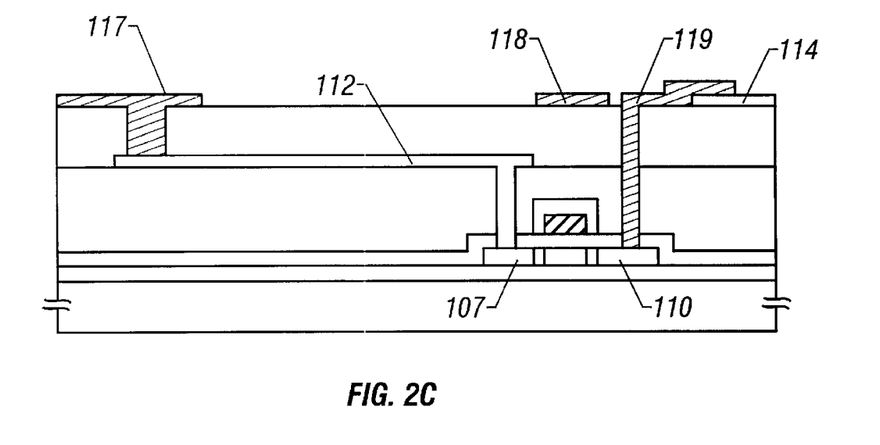

FIGS. 1 and 2 generally illustrate successive processing steps for the production of an active matrix LCD device according to a first embodiment of the present invention. First, silicon dioxide is coated to a thickness of 3000 Å on a substrate 101 which is constructed with a sheet of glass or quartz to form an undercoat 102 thereupon. This undercoat 102 may be formed by a plasma chemical vapor deposition (CVD) process or a sputtering process.

The silicon dioxide undercoat 102 helps suppress diffusion of impurities from the substrate 101 and make mechanical stresses occurring between the substrate 101 and a later-produced semiconductor layer less severe. When a sheet of quartz is used as the substrate 101, it is preferable to produce a thick anodic oxidization film which forms the undercoat 102. This is because the quartz substrate shrinks much less than the silicon dioxide undercoat 102 when heated so that stresses are likely to occur between the substrate 101 and the semiconductor layer.

After the undercoat 102 has been completed, there is formed an amorphous silicon film which will serve as a starting layer for producing an active layer of each thin-film transistor. This amorphous silicon film is made 500 Å thick, for instance. Either the plasma CVD process or low-pressure thermal CVD process may be used to produce the amorphous silicon film.

Thin-film transistors may be produced on top of the amorphous silicon film if they are not required to provide high performance. If, however, high-quality display is desired, the amorphous silicon film should be converted into a crystalline silicon film. Described below is an example of a processing step by which the amorphous silicon film is converted into a crystalline silicon film.

Specifically, a crystalline silicon film having high crystallinity is obtained with the aid of a metallic element which accelerates crystallization of silicon. In this process, a solution of acetate nickel adjusted to a specific level of concentration is applied to the surface of the amorphous silicon film at first. Excess solution is then removed by means of a spinner. Now that a layer of nickel is held directly on the surface of the amorphous silicon film, the substrate 101 is subjected to a temperature of 620° C. for a period of four hours. The crystalline silicon film is obtained through this heat treatment.

Besides the above crystallization method, the crystalline silicon film can be obtained by a laser beam irradiation method, a simple heat treatment method, a high-energy infrared heating method, or a combination thereof.

The crystalline silicon film is then patterned to obtain a structure as shown in FIG. 1(A), in which the glass substrate 101 is covered with the silicon dioxide undercoat 102 which carries active layers 103 (island semiconductor layers) for producing individual thin-film transistors. The following discussion is based on the assumption that the active layers 103 are constructed of crystalline silicon.

When the structure illustrated in FIG. 1(A) has been obtained, a silicon dioxide film which will serve as a gate insulation layer 104 is deposited to a thickness of 1000 Å by the plasma CVD process or sputtering process. Further, a layer of aluminum containing 0.2% scandium by weight is formed on top of the silicon dioxide film to a thickness of 6000 Å. This aluminum layer is then patterned to produce individual gate electrodes 105. The gate electrodes 105 thus produced constitute a first circuit layer.

Figure 3:
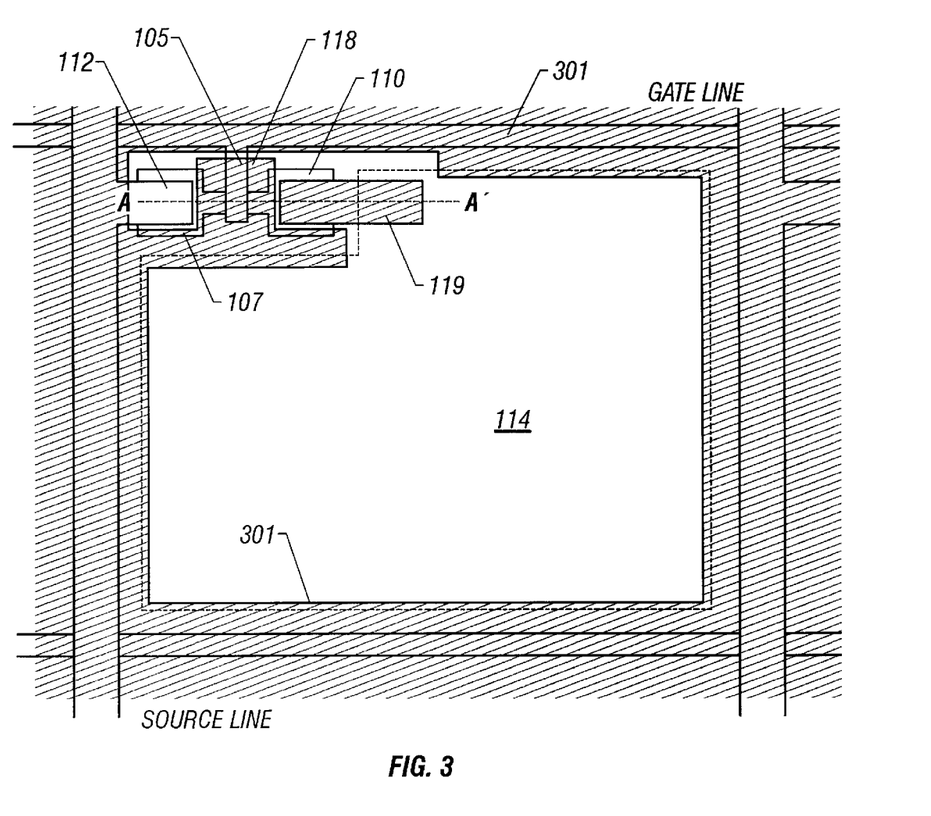
FIG. 3 is a top view generally illustrating the configuration of a single pixel of the active matrix circuit.

It is important that the gate electrodes 105 is constructed with aluminum. As illustrated in FIG. 3, each gate electrode 105 branches out from one of gate buses which are arranged in a matrix form. In a case where resistances associated with these bus lines can not be disregarded, signal delays and/or operational errors may result. This problem becomes particularly evident in large-screen LCD devices. The use of aluminum, which is a low-resistance material, for constructing the gate electrodes 105 and gate buses in this embodiment therefore offers remarkable advantages.

After the gate electrodes 105 have been completed, the gate electrodes 105 are anodized in an electrolytic solution of ethylene glycol of about pH 7 containing 3 to 10% of tartaric acid. In this anodic oxidization process, an anodic oxide film 106 having fine and dense composition is deposited to a thickness of 2500 Å to cover each gate electrode 105. The anodic oxide films 106 thus created serve to prevent abnormal growth of aluminum as well as development of cracks. The anodic oxide films 106 also serve as a mask when producing offset gate regions through a dopant ion implantation process.

When the structure illustrated in FIG. 1(B) has been obtained. dopant ions for producing source and drain regions are implanted. In this embodiment, a plasma doping process is used to implant phosphor ions for creating n-channel thin-film transistors.

By the implantation of phosphor ions, source regions 107 and drain regions 110 are created through a self-alignment process. Conducting channel regions 109 and offset gate regions 108 are also created through a self-alignment process, as shown in FIG. 1(C).

Upon completion of the implantation of dopant ions shown in FIG. 1(C), a laser beam is irradiated for annealing the source regions 107 and drain regions 110. The annealing process serves to activate the implanted phosphor ions and remove damages to the crystalline lattice caused by the implantation of the phosphor ions.

Then, a first interlayer dielectric film 111 is produced as shown in FIG. 1(D) by depositing a layer of silicon dioxide to a thickness of 5000 Å by the plasma CVD process. Then, contact holes reaching to the individual source regions 107 are created. It is to be noted that in a case where silicon dioxide is used for forming the first interlayer dielectric film 111, a titanium film of a later-produced circuit may react with the silicon dioxide film, resulting in formation of titanium oxide. Should this happen, it is preferable to produce a silicon nitride film instead of the silicon dioxide film or a two-layer structure including silicon nitride and silicon dioxide films.

Source lines 112 connecting to the individual source regions 107 are formed as illustrated in FIG. 2(A). Each source line 112 is constructed with a stacked deposition of a titanium film and an aluminum film. In this embodiment, the titanium film is made 500 Å thick while the aluminum film is 4000 Å made thick by the sputtering process. The source lines 112 thus produced constitute together a second circuit layer.

The titanium film is provided to prevent direct contact between aluminum and silicon. This is because if they are allowed to come into mutual contact, a catalytic reaction will take place, resulting in poor contact or a variation in contact resistance with the lapse of time. Each source line 112 branches out and connects to the source region 107 arranged in each individual pixel as shown in FIG. 3.

A second interlayer dielectric film 113 is then produced to a thickness of 4000 Å as shown in FIG. 2(B). The second interlayer dielectric film 113 is produced by depositing silicon dioxide by the plasma CVD process. It may be constructed with a silicon nitride film instead of a silicon dioxide film to prevent conversion of the later-produced titanium film into a titanium oxide film. Alternatively, a two-layer structure including silicon dioxide and silicon nitride films or a three-layer structure including silicon nitride, silicon dioxide and silicon nitride films may be employed.

Next, an ITO layer which constitutes pixel electrodes 114 is produced. Tin oxide ($SnO_2$) can also be used as an alternative to ITO. What is essential for materials for constructing the pixel electrodes 114 is their capability to create a transparent conductive coating.

Contact holes 115 and 116 are then produced as shown in FIG. 2(B). The contact holes 115 are openings in which wiring to surrounding circuit elements is formed while the contact holes 116 are openings through which the individual drain regions 110 are connected to the respective pixel electrodes 114.

Subsequently, a three-layer structure including a titanium film, an aluminum film and another titanium film which form together a third circuit layer is produced by sputtering or evaporation. This third circuit layer is patterned to create the following elements:

(1) Conductor lines 117 for connecting to surrounding circuit elements and external circuitry;

(2) Masking films 118 for masking the thin-film transistors;

(3) Conductor lines 119 for connecting outputs from the individual drain regions 110 to the respective pixel electrodes 114; and (4) A black matrix which is not illustrated in FIGS. 2(A)–2(C). (The black matrix is designated by the numeral 301 in FIG. 3.)

The aforementioned three-layer structure in which the aluminum film is sandwiched between the two titanium films offers the following advantages:

Good electrical contact with the drain regions 110;

Good electrical contact with the source lines 112 in the second circuit layer; and Good electrical contact with the ITO pixel electrodes 114.

FIG. 3 is a top view generally illustrating the configuration of a single pixel of the active matrix circuit of FIGS. 2(A)–2(C), where FIG. 2(C) is a cross-sectional view taken along lines A—A' shown in FIG. 3. FIG. 3 depicts part of the black matrix 301 which encloses the individual pixel electrodes 114. As is apparent from FIG. 3, the black matrix 301 and the masking film 118 of each thin-film transistor are connected to each other by a continuous film structure in this embodiment. In one variation of the embodiment, the black matrix 301 and the individual masking films 118 may be constructed as separate elements. It is not, however, preferable to electrically connect the masking films 118 to the conductor lines 119 because such an arrangement will develop undesirable stray capacitance.

It is to be noted that FIG. 3 does not show the conductor line 117 which is illustrated in FIG. 2(C). The conductor line 117 is actually connected to an end of the source line 112 at an edge of each pixel electrode 114.

SECOND EMBODIMENT

The second embodiment of the invention features a different construction of gate electrodes in comparison with the first embodiment. More particularly, each gate electrode is formed in a three-layer structure including a titanium film, an aluminum film and another titanium film.

Figure 4A:
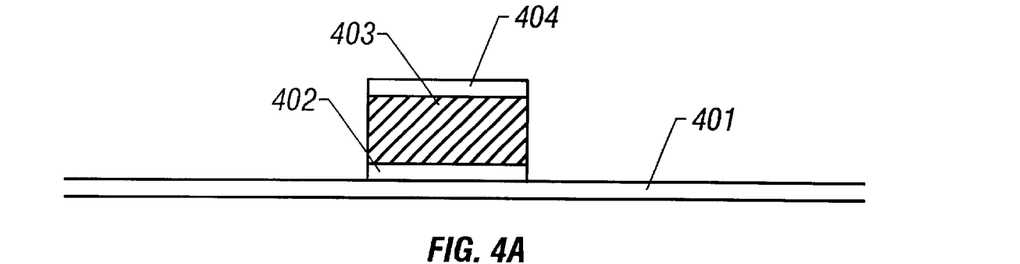
FIGS. 4(A)–4(D) illustrate the general construction of a gate electrode according to a second embodiment of the invention.

FIGS. 4(A)–(D) illustrate how a gate electrode of the second embodiment is produced. Shown in FIG. 4(A) is an unfinished gate electrode which has been produced by forming a titanium film 402 to a thickness of about 100 Å on top of a gate insulation layer 401, a aluminum film 403 containing a small amount of scandium to a thickness of 5000 Å on top of the titanium film 402, and a titanium film 404 to a thickness of about 100 Å on top of the aluminum film 403, and then patterning this three-layer structure of the titanium film 402, aluminum film 403 and titanium film 404 to the shape of a gate electrode.

Figure 4B:
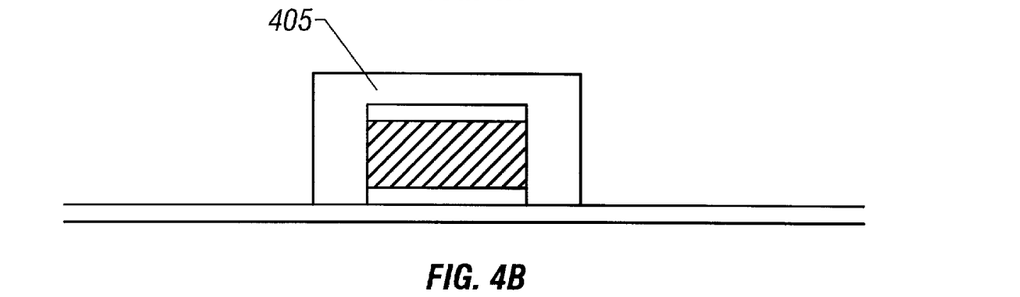

After the structure shown in FIG. 4(A) has been obtained, it is subjected to an anodic oxidization process, in which an anodic oxide film 405 having fine and dense composition is deposited to a thickness of 200 Å around the gate electrode which comprises the titanium film 402, aluminum film 403 and titanium film 404, as shown in FIG. 4(B). Since the anodic oxide film 405 created in this process is made of titanium oxide and aluminum oxide, it is difficult to form the anodic oxide film 405 to a thickness of more than a few hundred Å.

Figure 4C:
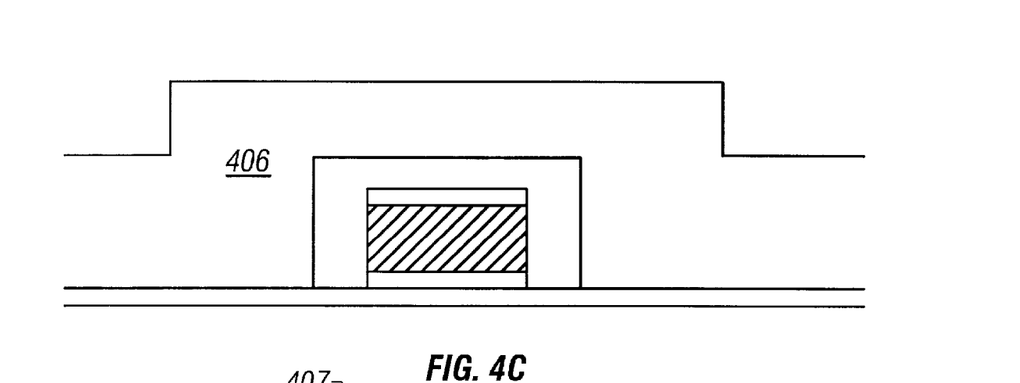

Next, a silicon nitride film 406 is formed as a first interlayer dielectric film to a thickness of 4000 Å by the plasma CVD process, as shown in FIG. 4(C).

Figure 4D:
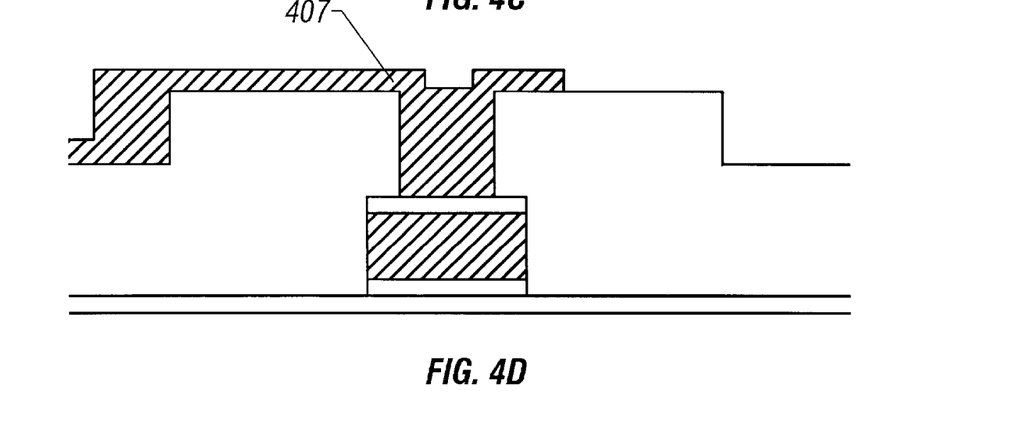

Then, a contact hole is created for forming an aluminum conductor line 407 which connects to the titanium film 404 of the gate electrode. and the aluminum conductor line 407 is produced down to the titanium film 404 as shown in FIG. 4(D). It is to be noted that the aluminum conductor line 407 is formed in a peripheral area away from where a thin-film transistor is located.

According to this construction, there is no chance of direct contact between the gate insulation layer 401 and aluminum film 403 so that intrusion of abnormal growth of aluminum into the gate insulation layer 401 does not occur at all. Furthermore, it is possible to achieve desirable interface characteristics of the junction between the gate insulation layer 401 and the gate electrode which comprises the titanium film 402, aluminum film 403 and titanium film 404. This also ensures improved operation of the individual thin-film transistors.

In addition, the second embodiment facilitates etching of the anodic oxide film 405 on the top surface of the gate electrode for making the contact hole in which the aluminum conductor line 407 is created. It is difficult to selectively remove the anodic oxide film 405 alone if it is formed directly on aluminum. The three-layer structure of the gate electrode of this embodiment provides a solution to this problem in etching.

The structure of the second embodiment may be combined with that of the first embodiment in order to achieve further improvements in production yield and manufacturing costs as well as device reliability.

What is claimed is:

1. A semiconductor device comprising:

a thin film transistor;

a conductive oxide film which constitutes a pixel electrode;

a conductive layer to interconnect said conductive oxide film and a drain region of said thin-film transistor;

a masking film constructed with the same material as said conductive layer to mask said thin-film transistor; and a masking film constructed with the same material as said conductive layer to mask edges of said pixel electrode;

wherein said conductive layer has a layer structure including an aluminum film sandwiched between a pair of titanium films.

2. A semiconductor device according to claim 1, wherein said conductive oxide film comprises a material selected from the group consisting of indium tin oxide (ITO) and tin oxide ($SnO_2$).

3. A semiconductor device according to claim 1 wherein said aluminum film is prevented from directly contacting either said drain or said conductive oxide film, respectively by said pair of titanium films interposed therebetween.

4. A semiconductor device comprising:

a thin film transistor;

a conductive oxide film which constitutes a pixel electrode;

a first conductive layer to interconnect said conductive oxide film and a drain region of said thin-film transistor;

a first masking film constructed with the same material as said first conductive layer to mask said think-film transistor;

a second masking film constructed with the same material as said first conductive layer to mask edges of said pixel electrode;

a second conductive layer connected to a source region of said thin-film transistor;

an outgoing conductive layer constructed with the same material as said first conductive layer, said outgoing conductive layer being connected to said second conductive layer;

wherein said first conductive layer has a layer structure including an aluminum film sandwiched between a pair of titanium films.

5. A semiconductor device according to claim 4, wherein said second conductive layer has a layer structure including a titanium film and an aluminum film.

6. A semiconductor device according to claim 4, wherein said conductive oxide film is constructed with a layer of indium tin oxide (ITO) or tin oxide ($SnO_2$).

7. A semiconductor device according to claim 4 wherein said aluminum film is prevented from directly contacting either said drain and said conductive oxide film, respectively by said pair of titanium films interposed therebetween.

8. A semiconductor device comprising:

a thin film transistor having a semiconductor film comprising at least a channel forming region and a pair of impurity regions on an insulating surface, and a gate electrode adjacent to said channel forming region;

a first interlayer insulating film over said thin film transistor;

a second interlayer insulating film over said first interlayer insulating film;

a first wiring having a first part penetrating said first interlayer insulating film to have an electrical contact with one of the impurity regions, a second part connected to said first part and disposed between said first and second interlayer insulating films, and a third part penetrating said second interlayer insulating film to contact said second part;

a second wiring electrically connected with the other one of the impurity regions through said first and second interlayer insulating films; and a pixel electrode formed adjacent said second interlayer insulating film and electrically connected with said other one of the impurity regions through said second wiring, wherein said third part of said first wiring and said second wiring include a pair of conductive material films and an aluminum film interposed therebetween.

9. A device according to claim 8 wherein said first wiring is electrically connected with said one of the impurity regions through another electrode.

10. A device according to claim 8 wherein said first interlayer insulating film comprises silicon oxide.

11. A device according to claim 8 wherein said second interlayer insulating film comprises at least one or more layers that are selected from silicon oxide film and silicon nitride film.

12. A device according to claim 8 wherein said conductive material includes titanium.

13. A device according to claim 8 wherein said pixel electrode comprises a material selected from a group consisting of indium tin oxide (ITO) and tin oxide ($SnO_2$).

14. A device according to claim 8, further comprising a plurality of other thin film transistors disposed relative to said thin film transistor to form an active matrix display device.

15. A semiconductor device comprising:
- a thin film transistor having a semiconductor film comprising at least a channel forming region and a pair of impurity regions on an insulating surface, and a gate electrode adjacent to said channel forming region;
- a first interlayer insulating film over said thin film transistor;
- a second interlayer insulating film over said first interlayer insulating film;
- a first wiring having a first part penetrating said first interlayer insulating film to have an electrical contact with one of the impurity regions, a second part connected to said first part and disposed between said first and second interlayer insulating films, and a third part penetrating said second interlayer insulating film to contact said second part;
- a second wiring electrically connected with the other one of the impurity regions through said first and second interlayer insulating films;
- a pixel electrode formed adjacent said second interlayer insulating film and electrically connected with the other one of the impurity regions through said second wiring; and
- a peripheral circuit connected with said first wiring,
- wherein said third part of said first wiring and said second wiring include a pair of conductive material films and an aluminum film interposed therebetween.

16. A device according to claim 15 wherein said first wiring is electrically connected with said one of the impurity regions through another electrode.

17. A device according to claim 15 wherein said first interlayer insulating film comprises silicon oxide.

18. A device according to claim 15 wherein said second interlayer insulating film comprises one or more layers that are selected from silicon oxide film and silicon nitride film.

19. A device according to claim 15 wherein said conductive material is titanium.

20. A device according to claim 15 wherein said pixel electrode comprises a material selected from the group consisting of indium tin oxide (ITO) and tin oxide ($SnO_2$).

21. A device according to claim 15 further comprising a plurality of other thin film transistors disposed relative to said thin film transistor to form an active matrix display device.

22. A semiconductor device comprising:
- a thin film transistor having a semiconductor film comprising at least a channel forming region and source and drain regions on an insulating surface, and a gate electrode adjacent to said channel forming region;
- a first interlayer insulating film over said thin film transistor;
- a second interlayer insulating film over said first interlayer insulating film;
- a drain wiring electrically coupled to said drain region through said first and second interlayer insulating films, said drain wiring comprising a pair of conductive films and an aluminum film interposed therebetween;
- a pixel electrode formed over said second interlayer insulating film and electrically connected with said drain region through said drain wiring;
- a source wiring electrically coupled to said source region;
- a lead connected with said source wiring;
- a peripheral circuit connected with said lead; and
- a light blocking layer formed over at least said channel forming region of said semiconductor film, said light blocking layer comprising at least one material of said lead.

23. A device according to claim 22 wherein said conductive films include titanium.

24. A device according to claim 22 wherein said pixel electrode comprises a material selected from the group consisting of indium tin oxide (ITO) and tin oxide ($SnO_2$).

25. A device according to claim 22 further comprising a plurality of other thin film transistors disposed relative to said thin film transistor to form an active matrix display device.

26. A semiconductor device comprising:
- a thin film transistor having a semiconductor film comprising at least a channel forming region and a pair of impurity regions on an insulating surface, and a gate electrode adjacent to said channel forming region;
- a first interlayer insulating film over said thin film transistor;
- a second interlayer insulating film over said first interlayer insulating film;
- a lead electrically coupled to one of said impurity regions through said first and second interlayer insulating films, said lead comprising a pair of conductive films and an aluminum film interposed therebetween;
- a pixel electrode formed over said second interlayer insulating film and electrically connected with the one of said impurity regions by said lead; and
- a light blocking layer formed over at least said channel forming region of said semiconductor film and edge portions of the pixel electrode, said light blocking layer comprising at least one material of said lead.

27. A device according to claim 26 wherein said conductive films comprise titanium.

28. A device according to claim 26 wherein said pixel electrode comprises a material selected from the group consisting of indium tin oxide (ITO) and tin oxide ($SnO_2$).

29. A device according to claim 26 further comprising a plurality of other thin film transistors disposed relative to said thin film transistor to form an active matrix display device.

30. A semiconductor device comprising:
- a semiconductor film over an insulating surface, said semiconductor film having at least a channel forming region and a pair of impurity regions;
- a first interlayer insulating film over said thin film transistor;
- a second interlayer insulating film over said first interlayer insulating film;
- a first wiring having a first part penetrating said first interlayer insulating film to electrically connect one of the impurity regions, a second part positioned between said first and second interlayer insulating films and connected to said first part, and a third part penetrating said second interlayer insulating film to contact said second part;
- a peripheral circuit of said semiconductor device connected with said first wiring;

a pixel electrode over said second interlayer insulating film, said pixel electrode electrically connected with the other one of the impurity regions;

a second wiring formed of a material of said third part of said first wiring and electrically connected with said pixel electrode and said other one of the impurity regions through said first and second interlayer insulating films; and a light blocking layer over at least said channel forming region of said semiconductor film.

31. A device according to claim 30 wherein said first wiring is electrically connected with said one of the impurity regions through another electrode.

32. A device according to claim 30 wherein said first and second wirings comprises a pair of conductive films and an aluminum film interposed therebetween.

33. A device according to claim 30 wherein said pixel electrode comprises a material selected from a group consisting of indium tin oxide (ITO) and tin oxide ($SnO_2$).

34. A device according to claim 30 further comprising a plurality of other thin film transistors disposed relative to said thin film transistor to form an active matrix display device.

35. A semiconductor device comprising:

a semiconductor film over an insulating surface, said semiconductor film having at least a channel forming region and a pair of impurity regions;

a first interlayer insulating film over said thin film transistor;

a second interlayer insulating film over said first interlayer insulating film;

a first wiring electrically connected with one of the impurity regions through said first and second interlayer insulating films;

a peripheral circuit of said semiconductor device connected with said first wiring;

a pixel electrode over said second interlayer insulating film, said pixel electrode electrically connected with the other one of said impurity regions;

a second wiring formed of a material of said first wiring and electrically connected with said pixel electrode and said other one of the impurity regions through said first and second interlayer insulating films; and a light blocking layer over at least said channel forming region of said semiconductor film and edge portions of the pixel electrode.

36. A device according to claim 35 wherein said first wiring is electrically connected with said one of the impurity regions through another electrode.

37. A device according to claim 35 wherein each of said first and second wirings comprises a pair of conductive films and an aluminum film interposed therebetween.

38. A device according to claim 35 wherein said pixel electrode comprises a material selected from the group consisting of indium tin oxide (ITO) and tin oxide ($SnO_2$).

39. A device according to claim 35 further comprising a plurality of other thin film transistors disposed relative to said thin film transistor to form an active matrix display device.

40. A device as in claim 8, further comprising a light blocking layer formed over at least an edge portion of said pixel electrode and configured to include at least one material of said third part of said first wiring.

* * * * *